(12) United States Patent
Boyd

(10) Patent No.: US 6,366,006 B1
(45) Date of Patent: Apr. 2, 2002

(54) COMPOSITE PIEZOELECTRIC TRANSFORMER

(76) Inventor: Clark Davis Boyd, 3 Wells Ct., Hampton, VA (US) 23666

( * ) Notice: Subject to any disclaimer, the term of this patent is extended or adjusted under 35 U.S.C. 154(b) by 0 days.

(21) Appl. No.: 09/738,831

(22) Filed: Dec. 15, 2000

(51) Int. Cl.[7] .............................................. H01L 41/08
(52) U.S. Cl. ...................................... 310/359; 310/366
(58) Field of Search ................................. 310/359, 366

(56) References Cited

U.S. PATENT DOCUMENTS

| | | | | |
|---|---|---|---|---|
| 5,118,982 A | * | 6/1992 | Inoue et al. ................. | 310/366 |
| 5,861,704 A | * | 1/1999 | Kitami et al. ............... | 310/369 |
| 6,182,340 B1 | * | 2/2001 | Bishop ........................ | 310/357 |
| 6,215,227 B1 | * | 4/2001 | Boyd .......................... | 310/359 |
| 6,229,247 B1 | * | 5/2001 | Bishop ........................ | 310/328 |

FOREIGN PATENT DOCUMENTS

| | | | | |
|---|---|---|---|---|
| JP | 58-87885 A | * | 5/1983 | ................. 310/359 |
| JP | 5-235432 A | * | 9/1993 | ................. 310/359 |
| JP | 5-251785 A | * | 9/1993 | ................. 310/359 |
| JP | 11-330580 A | * | 9/1999 | ................. 310/359 |

* cited by examiner

*Primary Examiner*—Thomas M. Dougherty
(74) *Attorney, Agent, or Firm*—Stephen E. Clark; David J. Bolduc

(57) ABSTRACT

A multi-layer piezoelectric transformer (PT) is provided that is capable of achieving high mechanical momentum and, therefore, is capable of high energy transmission. The PT has a plurality of layers arranged as a composite structure. The outermost portions of the PT comprise the input portions, which are bonded to the central output portion of the PT. The construction and anisotropic nature of the PT allows it to be driven at the longitudinal resonant frequency of the PT corresponding to its overall thickness, which increases the achievable gain and power density of the PT.

15 Claims, 7 Drawing Sheets

UNDERLINE: PRIOR ART

UNDERLINE: PRIOR ART

COMPOSITE PIEZOELECTRIC TRANSFORMER

BACKGROUND OF INVENTION

1. Field of Invention

The present invention relates generally to a voltage converter using multiple layers of piezoelectric ceramic. More specifically, the present invention relates to a multilayer piezoelectric transformer using resonant vibrations along the longitudinal axis for step-up voltage conversion applications. The input and output layers are bonded to each other in such a manner that the piezoelectric transformer operates at a lower frequency, with higher gain and power density than a piezoelectric transformer simply using thickness mode vibrations.

2. Description of the Prior Art

Wire wound-type electromagnetic transformers have been used for generating high voltage in internal power circuits of devices such as televisions or fluorescent lamp ballasts. Such electromagnetic transformers take the form of a conductor wound onto a core made of a magnetic substance. Because a large number of turns of the conductor are required to realize a high transformation ratio, electromagnetic transformers that are effective, yet at the same time compact in shape are extremely difficult to produce. Furthermore, in view of high frequency applications, the electromagnetic transformer has many disadvantages involving magnetic material of the electromagnetic transformer, such as sharp increase in hysteresis loss, eddy-current loss and conductor skin-effect loss. Those losses limit the practical frequency range of magnetic transformers to not above 500 kHz.

To remedy this and many other problems of the wire-wound transformer, piezoelectric ceramic transformers (or PTs) utilizing the piezoelectric effect have been provided in the prior art. In contrast to electromagnetic transformers, PTs have a sharp frequency characteristic of the output voltage to input voltage ratio, which has a peak at the resonant frequency. This resonant frequency depends on the material constants and dimensions of the materials of construction of the transformer including the piezoelectric ceramics and electrodes and the mode of operation of the transformer. Furthermore PTs have a number of advantages over general electromagnetic transformers. The size of PTs can be made much smaller than electromagnetic transformers of comparable transformation ratio, PTs can be made nonflammable, and produce no electromagnetically induced noise.

The ceramic body employed in PTs takes various forms and configurations, including rings, flat slabs and the like. Typical examples of a prior PTs are illustrated in FIGS. 1 and 2. This type of PT is commonly referred to as a "Rosen-type" piezoelectric transformer. The basic Rosen-type piezoelectric transformer was disclosed in U.S. Pat. No. 2,830,274 and numerous variations of this basic apparatus are well known in the prior art. The typical Rosen-type PT comprises a flat ceramic slab 20 appreciably longer than it is wide and substantially wider than it is thick. In the case of FIG. 1, the piezoelectric body 20 is in the form of a flat slab that is considerably wider than it is thick, and having greater length than width.

As shown in FIG. 1, a piezoelectric body 20 is employed having some portions polarized differently from others. A substantial portion of the slab 20, the generator portion 22 to the right of the center of the slab is polarized longitudinally, and has a high impedance in the direction of polarization. The remainder of the slab, the vibrator portion 21 is polarized transversely to the plane of the face of the slab (in the thickness direction) and has a low impedance in the direction of polarization. In this case the vibrator portion 21 of the slab is actually divided into two portions. The first portion 24 of the vibrator portion 21 is polarized transversely in one direction, and the second portion 26 of the vibrator portion 21 is also polarized transversely but in the direction opposite to that of the polarization in the first portion 24 of the vibrator portion 21.

In order that electrical voltages may be related to mechanical stress in the slab 20, electrodes are provided. If desired, there may be a common electrode 28, shown as grounded. For the primary connection and for relating voltages at opposite faces of the low impedance vibrator portion 21 of the slab 20, there is an electrode 30 opposite the common electrode 28. For relating voltages to stresses generated in the longitudinal direction in the high impedance generator portion 22 of the slab 20, there is a secondary or high-voltage electrode 35 on the end of the slab for cooperating with the common electrode 28. The electrode 35 is shown as connected to a terminal 34 of an output load 36 grounded at its opposite end.

In the arrangement illustrated in FIG. 1, a voltage applied between the electrodes 28 and 30 of the low impedance vibrator portion 21 is stepped up to a higher voltage between the electrodes 28 and 35 in the high impedance generator portion for supplying the load 36 at a much higher voltage than that applied between the electrodes 28 and 30. The applied voltage causes a deformation of the slab through proportionate changes in the x-y and y-z surface areas. More specifically, the Rosen PT is operated by applying alternating voltage to the drive electrodes 28 and 30, respectively. A longitudinal vibration is thereby excited in the low impedance vibrator portion 21 in the transverse effect mode ("d31 mode"). The transverse effect mode vibration in the low impedance vibrator portion 21 in turn excites a vibration in the high impedance generator portion 22 in a longitudinal effect longitudinal vibration mode ("g33 mode"). As the result, high voltage output is obtained between electrode 28 and 35. On the other hand, for obtaining output of step-down voltage, as appreciated, the high impedance portion 22 undergoing longitudinal effect mode vibration may be used as the input and the low impedance portion 21 subjected to transverse effect mode vibration as the output.

The Rosen type PT has been found disadvantageous in that the only useable coupling coefficient is k31, which is associated with the very small transverse effect longitudinal vibration mode ("d31 mode"). This results in obtaining only a very small bandwidth. Conventional piezoelectric transformers like this operate only up to about 200 kHz.

Another inherent problem of such prior PTs is that they have relatively low power transmission capacity. This disadvantage of prior PTs relates to the fact that little or no mechanical advantage is realized between the vibrator portion 21 of the device and the driver portion 22 of the device, since each is intrinsically a portion of the same electroactive member. This inherently restricts the mechanical energy transmission capability of the device, which, in turn, inherently restricts the electrical power handling capacity of such devices.

Additionally, even under resonant conditions, because the piezoelectric voltage transmission function of Rosen-type PTs is accomplished by proportionate changes in the x-y and y-z surface areas (or, in certain embodiments, changes in the x-y and x'-y' surface areas) of the piezoelectric member, which changes are of relatively low magnitude, the power handling capacity of prior circuits using such piezoelectric transformers is inherently low.

In addition, with the typical Rosen transformer, it is generally necessary to alternately apply positive and negative voltages across opposing faces of the vibrator portion 21 of the member in order to "push" and "pull", respectively, the member into the desired shape.

Even under resonant conditions, prior electrical circuits that incorporate such prior PTs are relatively inefficient, because the energy required during the first half-cycle of operation to "push" the piezoelectric member into a first shape is largely lost (i.e. by generating heat) during the "pull" half-cycle of operation. This heat generation corresponds to a lowering of efficiency of the circuit, an increased fire hazard, and/or a reduction in component and circuit reliability.

Furthermore, in order to reduce the temperature of such heat generating circuits, the circuit components (typically including switching transistors and other components, as well as the transformer itself) are oversized, which reduces the number of applications in which the circuit can be utilized, and which also increases the cost/price of the circuit.

Because the power transmission capacity of such prior PTs is so low, it has become common in the prior art to combine several such transformers together into a multi-layer "stack" in order to achieve a greater power transmission capacity than would be achievable using one such prior transformer alone. This, of course, increases both the size and the manufacturing cost of the transformer.

Also generally known are PTs polarized and vibrating in the thickness direction (i.e., vibrations are parallel to the direction of polarization of the layers). Illustrative of such "thickness mode" vibration PTs is the device of U.S. Pat. No. 5,118,982 to Inoue shown in FIGS. 3 and 4. A thickness mode vibration PT typically comprises a low impedance portion 11 and a high impedance portion 12 stacked on each other. The low impedance portion 11 and the high impedance portion 12 of the thickness mode PT typically comprises a series of laminate layers of ceramic alternating with electrode layers. Each portion is composed of at least two electrode layers and at least one piezoelectric material layer. Each of the piezoelectric ceramic layers of the low impedance portion 11 and the ceramic layer of the high impedance portion 12 are polarized in the thickness direction (perpendicular to the plane of the interface between the ceramic layers). Every alternate electrode layer in each portion 11 or 12 may be connected to each other and to selected external terminals.

The thickness mode PT of FIG. 3 comprises a low impedance vibrator portion 11 including a plurality of piezoelectric layers and a high impedance vibrator portion 12 including a piezoelectric layer, each of the layers being integrally laminated, as shown in FIG. 4, and caused to vibrate in thickness-extensional mode.

The low impedance portion 11 has a laminated structure which comprises multi-layered piezoelectric layers each being interposed between electrodes including the top surface electrode layer 201 and internal electrode layers 131 through 134. The high impedance portion 12 is constructed of the bottom electrode layer 202, an internal electrode layer 134 and a single piezoelectric layer interposed between both electrode layers 202 and 134. Polarization in each piezoelectric layer is, as indicated by arrows, in the direction of thickness, respectively. In the low impedance portion 11, alternating piezoelectric layers are polarized in opposite directions to each other. The polarization in the high impedance portion 12 is also in the direction of thickness.

The three-terminal construction of FIG. 3 has a common electrode 134 to which one terminal 16 of each portion is connected. A four-terminal construction as in FIG. 4 includes a pair of terminals 16 and 17 for the low impedance portion 11 and another pair of terminals 18 and 19 for the high impedance portion 12. The thickness each of the layers of the PT of FIGS. 3 or 4 is equal to a half wavelength (lambda/2) or one full wavelength (lambda) of the drive frequency.

When an alternating voltage is applied to the electrode layers across the ceramic layer of the vibrator portion 11, a vibration is excited in the ceramic layers parallel to the direction of the polarization of the layers in the longitudinal vibration mode ("d33 mode"). This vibration of the low impedance portion 11 excites a vibration in the high impedance portion 12. As the high impedance portion 12 vibrates, the g33 mode deformation of the high impedance portion 12 generates an electrical voltage across the electrodes of the high impedance portion 12. When operating the PT in the thickness-extensional mode, the resonance frequency of the PT in a lambda/2 mode or lambda mode depends on the thickness of the individual layers of the PT and the PT therefore operates in a frequency range of 1–10 MHz. More specifically, the thickness of each of the individual layers of the PT must equal an integral number of half wavelengths of the resonant frequency at which the PT operates.

A problem with prior thickness mode PTs is that the thickness mode resonant frequency is too high for some applications.

Another problem with prior thickness mode PTs is that they do not have a sufficient power transmission capacity for some applications.

Another problem with prior thickness mode PTs is that the addition of ceramic layers to the PT does not significantly raise the power density of such devices and may increase capacitive and dielectric losses.

Accordingly, it would be desirable to provide a piezoelectric transformer design that has a higher power transmission capacity than similarly sized prior piezoelectric transformers.

It would also be desirable to provide a piezoelectric transformer that is smaller than prior piezoelectric transformers that have similar power transmission capacities.

It would also be desirable to provide a piezoelectric transformer in which the "driver" portion of the device and the "driven" portion of the device are not the same electroactive element.

It would also be desirable to provide a piezoelectric transformer that develops a substantial mechanical advantage between the driver portion of the device and the driven portion of the device.

It would also be desirable to provide a piezoelectric transformer that, at its natural frequency, oscillates with greater momentum than is achievable with comparably sized prior piezoelectric transformers.

It would also be desirable to provide a piezoelectric transformer that does not generate as much heat as prior devices, and therefore has decreased loss due to the heat.

SUMMARY OF THE INVENTION

According to the present invention, there is provided a composite piezoelectric transformer (PT) preferably operating at its natural (i.e. "resonant") frequency predominantly in the longitudinal mode. The resonant PT converts a transformer input signal of a first character (i.e. voltage, frequency and current) to a transformer output signal of a second character (i.e. voltage, frequency and current). The disclosed PT efficiently accomplishes the described signal conversion by subjecting the input "driver" sections of the PT to an alternating voltage which causes the input portions to deform and vibrate, which in turn causes the output portion to vibrate, which in turn causes the "driven" output portion of the PT to deform, and which in turn generates an output voltage at the driven section of the transformer.

The outermost portions of the PT comprise the input portions which are bonded to the central output portion of the PT. The construction of the PT allows it to be driven at the longitudinal resonant frequency of the PT corresponding to its overall thickness, which increases the achievable gain and power density of the PT. The preferred embodiment of the invention provides a multi-layer piezoelectric transformer capable of achieving high mechanical momentum (and, therefore, is capable of high energy storage and transmission).

Accordingly, it is an object the present invention to provide a PT design that has a higher power transmission capacity than similarly sized prior PTs.

It is another object of the present invention to provide a PT that is smaller than prior PTs that have similar power transmission capacities.

It is another object of the present invention to provide a PT in which the "driver" portion of the device and the "driven" portion of the device are not the same electroactive element.

It is another object of the present invention to provide a PT that develops a substantial mechanical advantage between the driver portion of the device and the driven portion of the device.

It is another object of the present invention to provide a PT that, at its natural frequency, oscillates with greater momentum than is achievable in comparably sized prior PTs.

It is another object of the present invention to provide a PT that is relatively less expensive to manufacture than prior PTs that perform comparable signal transformation functions.

It is another object of the present invention to provide a PT that vibrates with greater momentum to achieve a higher gain than prior PTs.

It is another object of the present invention to provide a PT that vibrates with a lower frequency to achieve a higher gain than prior PTs.

It is another object of the present invention to provide a PT and that is simpler to manufacture than prior PTs having a laminate structure.

It is another object of the present invention to provide a PT that has fewer losses due to capacitive and dielectric losses.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which.

DESCRIPTION OF THE PREFERRED EMBODIMENT

In the present invention, a composite multilayer piezoelectric transformer is provided using a thickness mode resonant vibration along the PTs longitudinal dimension for step-up voltage conversion applications. The composite construction of the piezoelectric transformer provides a PT operating at a lower frequency (in the thickness direction of each layer but in the longitudinal direction of the composite structure), with higher gain and higher power density than a piezoelectric transformer of the same size simply using the conventional thickness mode vibration.

Typical Thickness Mode Piezoelectric Transformers (TMPTs) utilize a multilayer construction in attempting to provide greater voltage gain and power to circuit applications. The transformation ratio is typically substantially proportional to the square of the impedance ratio of the input and output portions. There is however a practical limit to the efficacy of added ceramic layers and after a certain point, additional ceramic layers do not contribute to the gain of the TMPT. In the present invention it has been found that using a specific construction of bonding together the layers of the PT and operating it in a specific mode may effectively raise the gain achievable in a PT.

The output power P of piezoelectric transformer operating in thickness-extensional mode vibration is expressed, based on a simplified consideration from the viewpoint of energy, approximately as:

$$P \alpha f_r \cdot V \cdot \epsilon_{33}{}^S \cdot k_t{}^2 \cdot P/Q_M$$

where $f_r$ is thickness-extensional mode resonance frequency, $\epsilon_{33}{}^S$ is constraint dielectric constant, V is volume of the piezoelectric transformer, $k_t$ is electromechanical coupling coefficient of thickness-extensional mode vibration, and $Q_M$ is the mechanical quality factor. Thus, in a PT the power output per unitary volume (power density) increases with greater electromechanical coupling coefficient $k_t$ and higher resonant frequency $f_r$ of piezoelectric ceramic resonator. By increasing the mechanical quality factor of the piezoelectric transformer, the power transmission efficiency can become higher. Using laminate techniques, prior PTs have had poor parallel precision and planeness which resulted in a low mechanical quality factor and lower power transmission efficiency.

Figure 1:
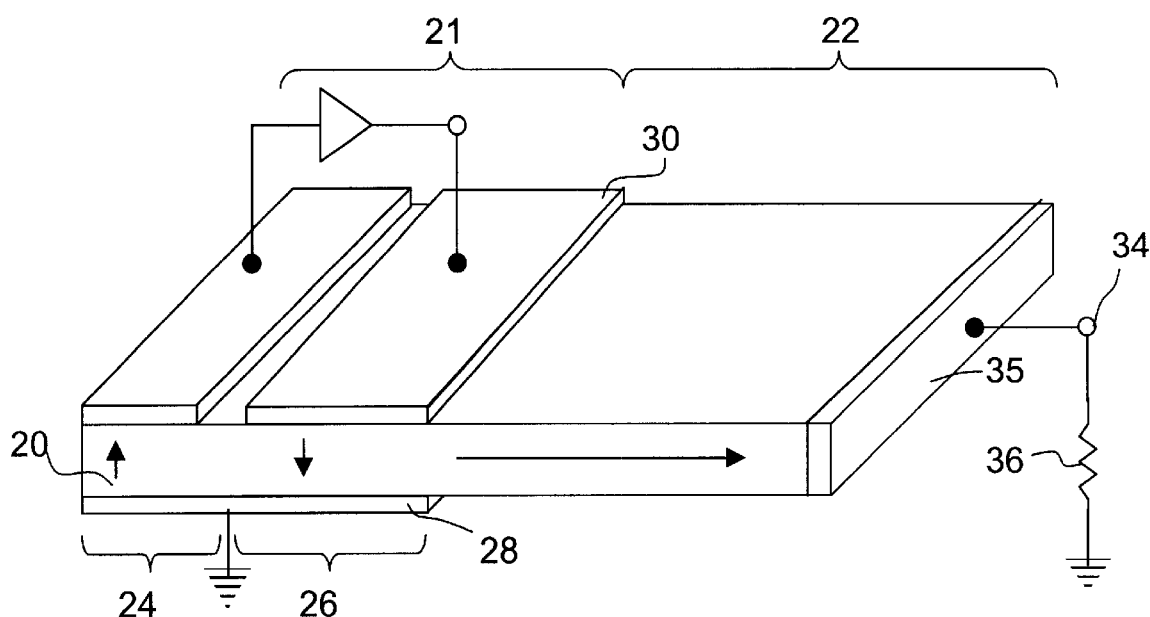
FIG. 1 is a partially schematic perspective view of a typical Rosen type piezoelectric transformer of the prior art.
Figure 2:
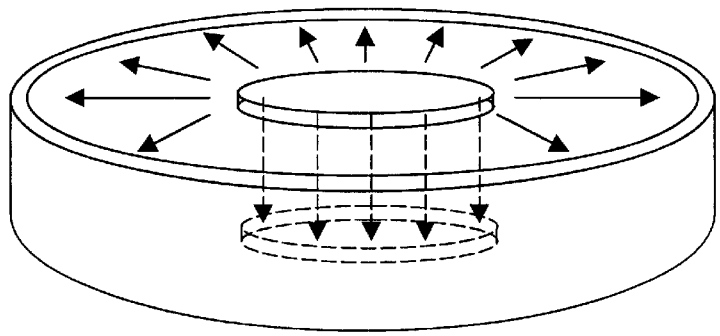
FIG. 2 is a perspective view of another example of a Rosen type piezoelectric transformer of the prior art.
Figure 3:
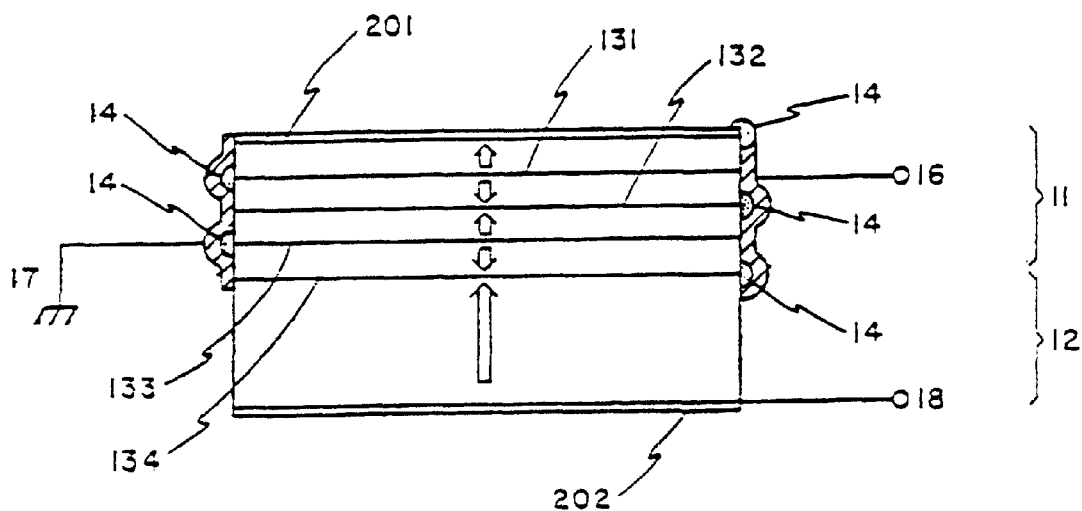
FIG. 3 is a perspective view of a typical multi-layer thickness mode vibration piezoelectric transformer of the prior art.
Figure 4:
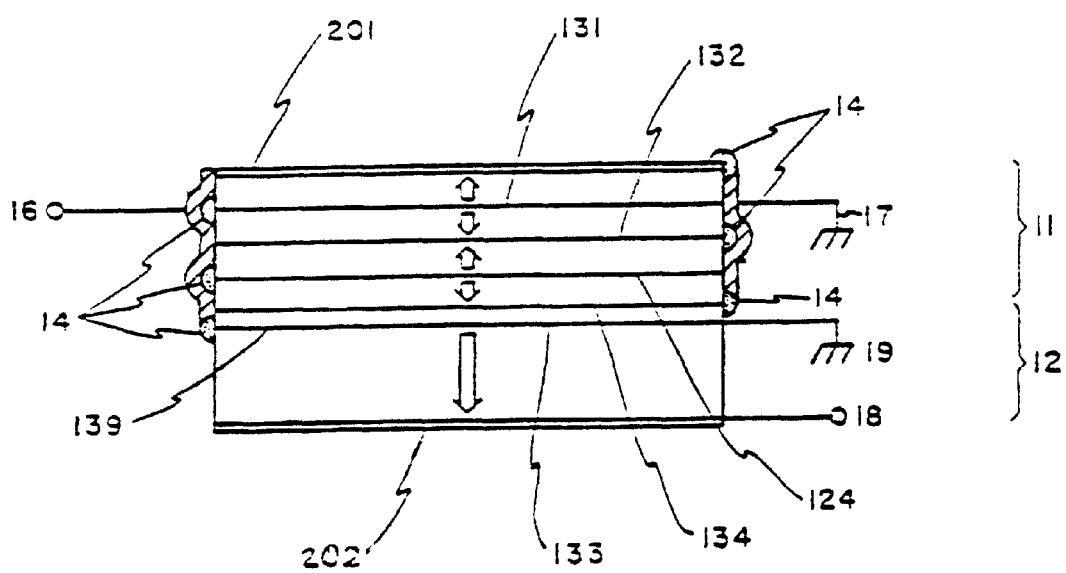
FIG. 4 is a perspective view of another multi-layer thickness mode vibration piezoelectric transformer of the prior art.
Figure 5:
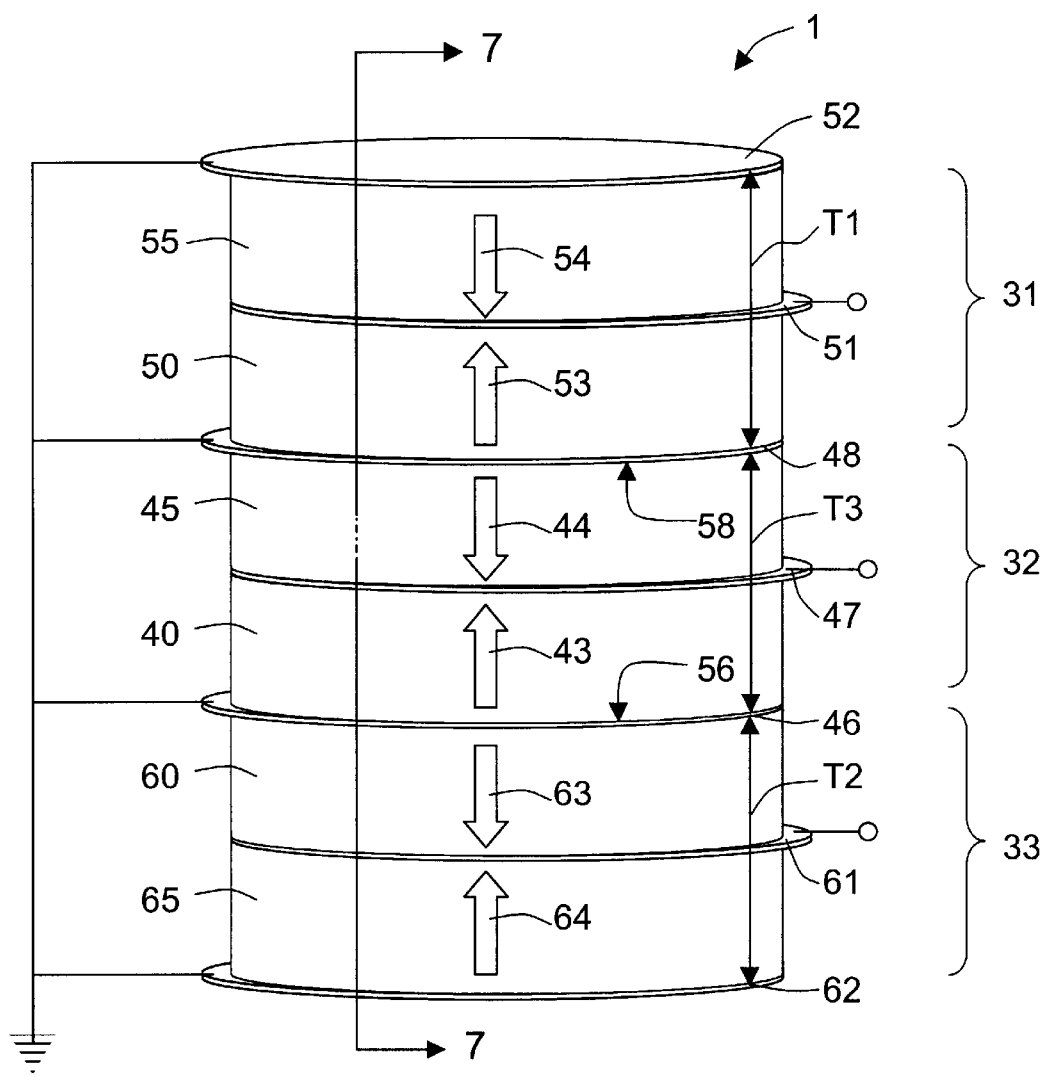
FIG. 5 is a perspective view of one embodiment of a piezoelectric transformer of the present invention having a cylindrical configuration.
Figure 6:
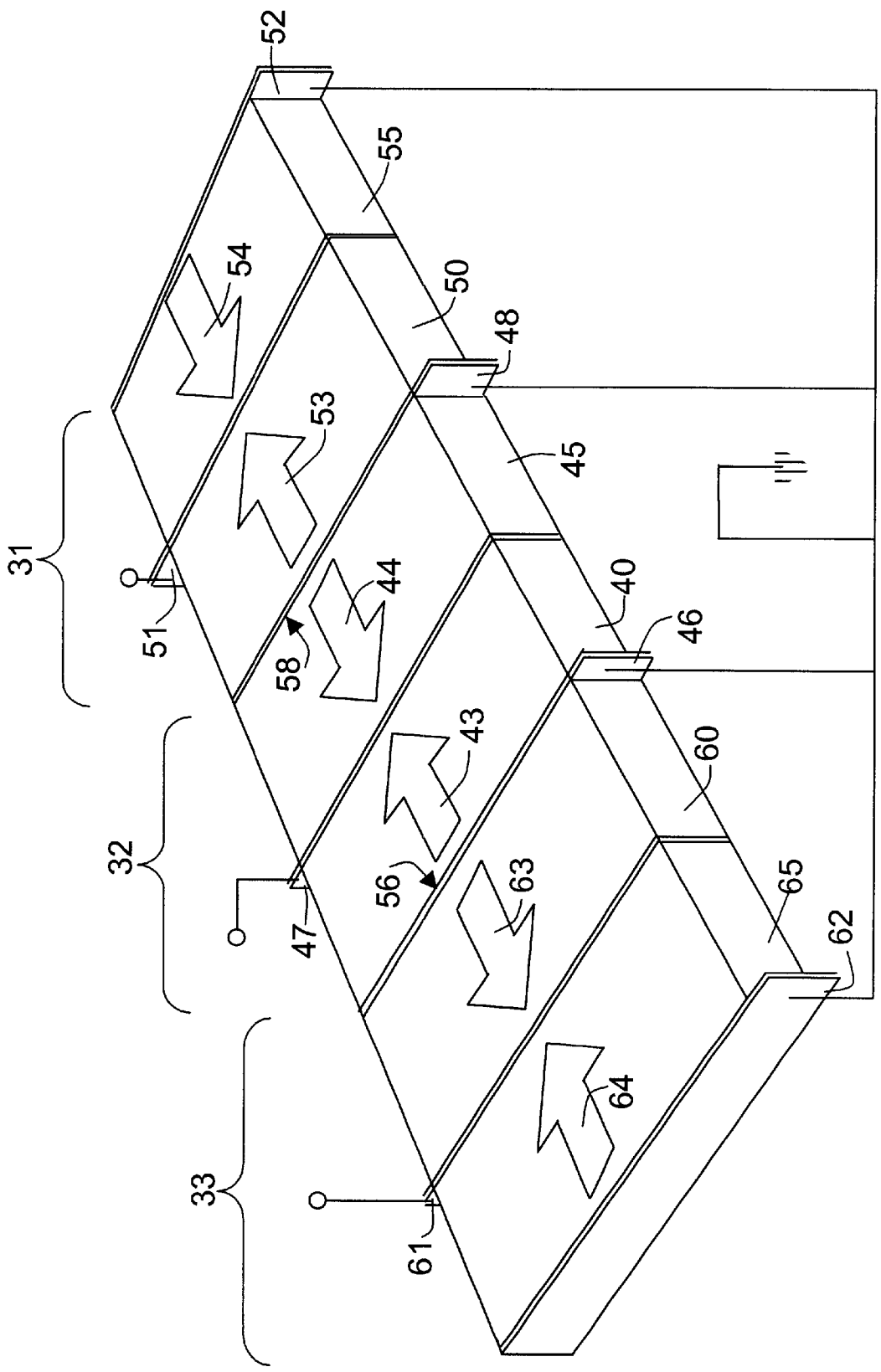
FIG. 6 is a perspective view of another embodiment of a piezoelectric transformer of the present invention with a rectangular configuration and showing the preferred electrical connections.
Figure 7:
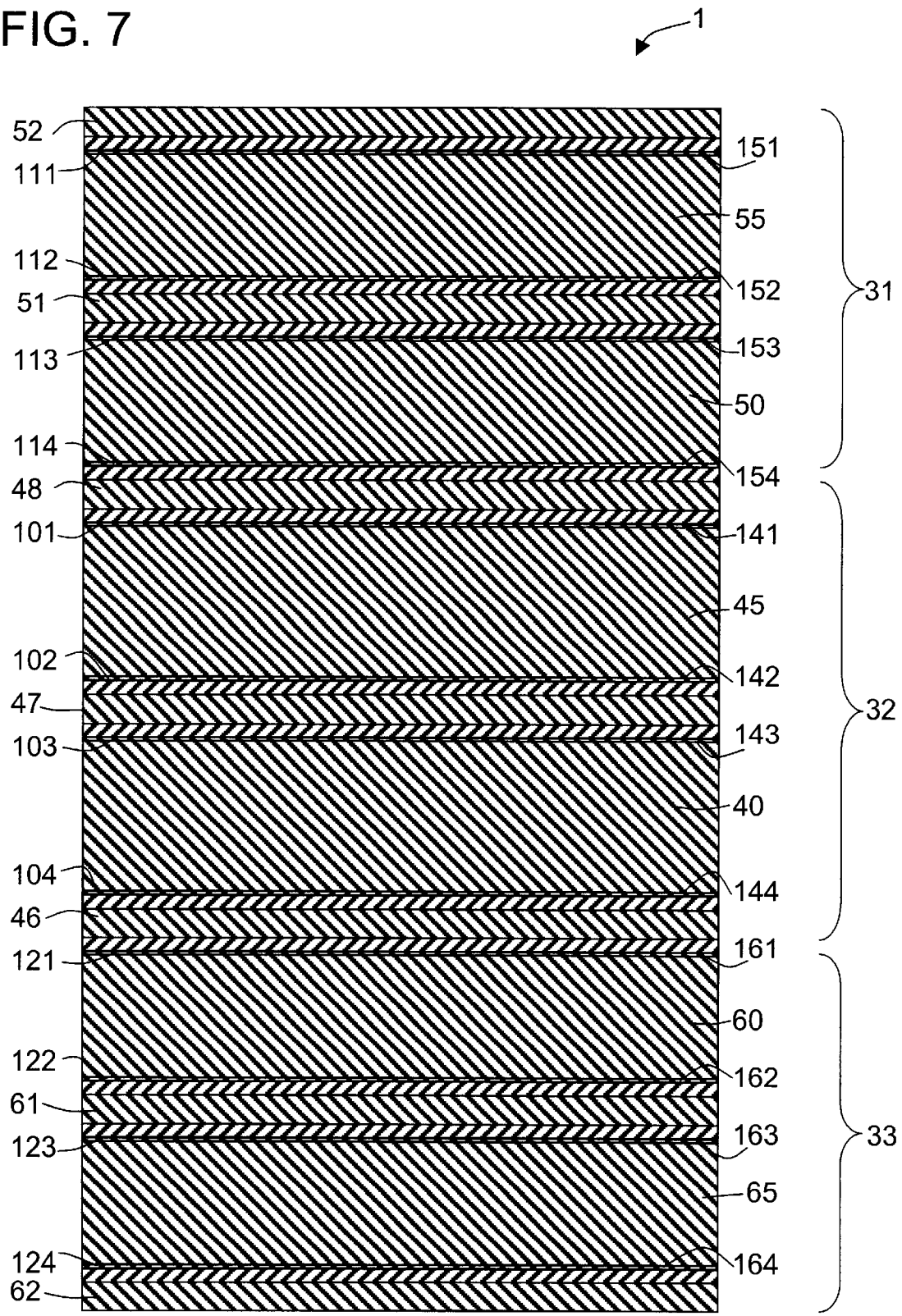
FIG. 7 is a cross-sectional elevation view of the transformer showing the details of construction of the various layers.

Referring to FIGS. 5–7: In the present invention, the PT comprises a composite structure having two input portions 31 and 33 and a central output portion 32. The first input portion 31 has a first thickness T1, the second input portion 33 has a second thickness T2 and the output portion 32 has a third thickness T3. The input portions 31 and 33 and the output portion 32 of the PT 1 are bonded together in a fashion that takes advantage of the lower frequency longitudinal resonant vibration mode of the whole transformer.

In the PT 1 of FIG. 5, the PT 1 has one output portion 32 located between two input portions 31 and 33. The output portion 32 of the PT 1 comprises two layers 40 and 45 of piezoelectric ceramic separated by an output terminal 47. Each of the two output layers 40 and 45 preferably comprises a circular disk of PZT material with electrodes (silver and/or nickel) electro-deposited thereon. More specifically the first output layer 40 has electrodes 143 and 144 deposited on its opposing major faces, and the second output layer 45 has electrodes 141 and 142 deposited on its opposing major faces. The two output layers 40 and 45 are each bonded along one of their major faces to a central output terminal 47. The central output terminal 47 preferably comprises a copper foil. On the remaining major faces of the output layers 40 and 45 are also bonded output terminals 46 and 48, each also preferably comprising copper foil. More specifically, one output terminal 46 is bonded to the remaining major face of the first output ceramic layer 40 and another output terminal 48 is bonded to the remaining major face of the second output ceramic layer 45. Bonding of the output layers 40 and 45 to the terminals 46, 47 and 48 is preferably accomplished using "Cibageigy AV118" (CIBA) adhesive manufactured by Ciba Specialty Chemicals Corporation, N.A. of East Lansing, Mich.

The output layers 40 and 45 are polarized in the thickness direction, i.e., in the direction perpendicular to the major faces of the disks 40 and 45. Preferably the direction of polarization of one output layer e.g., 40 is opposite to the direction of polarization of the other output layer e.g., 45. Most preferably, the output layers 40 and 45 are both polarized in the thickness direction towards the central output terminal 47 as indicated by arrows 43 and 44. Alternately, the layers 40 and 45 may be polarized in the thickness direction away from the central output terminal 47.

In the preferred embodiment of the PT, each of the input portions 31 and 33 comprises a pair of two piezoelectric ceramic input layers 50 and 55 and 60 and 65 respectively. The first input portion 31 of the PT 1 comprises two input layers 50 and 55 of piezoelectric ceramic separated by input terminal 51. Each of the two input layers 50 and 55 preferably comprises a circular disk of PZT material with electrodes (silver and/or nickel) electro-deposited thereon. More specifically the first input layer 50 has electrodes 153 and 154 deposited on its opposing major faces, and the second output layer 55 has electrodes 151 and 152 deposited on its opposing major faces. The two input layers 50 and 55 are each bonded along one of their major faces to the central input terminal 51. The central input terminal 51 preferably comprises a copper foil. One major face of the input portion 31, i.e., the remaining face of input layer 50, is bonded to an outboard input terminal 48 of the output portion 32. On the remaining major face of the input portion 31, i.e., the remaining face of input layer 55, is bonded an outboard input terminal 52, also preferably comprising copper foil. Bonding of the input layers 50 and 55 to the input terminals 48, 51 and 52 is preferably accomplished using CIBA adhesive.

The input layers 50 and 55 of the first input portion 31 are polarized in the thickness direction, i.e., in the direction perpendicular to the major faces of the disks. Preferably the direction of polarization of one input layer e.g., 50 is opposite to the direction of polarization of the other input layer e.g., 55. Most preferably, the input layers 50 and 55 are polarized in the direction toward the center input terminal 51 of the first input portion 31 as indicated by arrows 53 and 54. Alternately, the layers 50 and 55 may be polarized in the thickness direction away from the central input terminal 51.

The second input portion 33 of the PT 1 also comprises two input layers 60 and 65 of piezoelectric ceramic separated by input terminal 61. Each of the two input layers 60 and 65 preferably comprises a circular disk of PZT material with electrodes (silver and/or nickel) electro-deposited thereon. More specifically the first input layer 60 has electrodes 161 and 162 deposited on its opposing major faces, and the second output layer 65 has electrodes 163 and 164 deposited on its opposing major faces. The two input layers 60 and 65 of the second input portion 33 are each bonded along one of their major faces to a central input terminal 61. The central input terminal 61 preferably comprises a copper foil. One major face of the input portion 33, i.e., the remaining face of input layer 60, is bonded to an outboard input terminal 46 of the output portion 32. On the remaining major face of the input portion 33, i.e., the remaining face of input layer 65, is bonded an outboard input terminal 62, also preferably comprising copper foil. Bonding of the input layers 60 and 65 to the input terminals 46, 61 and 62 is preferably accomplished using CIBA adhesive.

The input layers 60 and 65 are polarized in the thickness direction, i.e., in the direction perpendicular to the major faces of the disks. Preferably the direction of polarization of one input layer e.g., 60 is opposite to the direction of polarization of the other input layer e.g., 65. Most preferably, the input layers 60 and 65 are polarized in the direction toward the center electrode 61 of the first input portion 33 as indicated by arrows 63 and 64. Alternately, the layers 60 and 65 may be polarized in the thickness direction away from the central input terminal 61.

FIG. 7 is a cross-sectional view of the PT 1 showing all the layers of the PT including the electrodes and adhesive layers. The output section 32 comprises a first output ceramic layer 45 having electrodes 141 and 142 on each of its major faces and an adhesive coating 101 and 102 covering each of the electrodes 141 and 142 respectively. The output section 32 also comprises a second output ceramic layer 40 having electrodes 143 and 144 on each of its major faces and an adhesive coating 103 and 104 covering each of the electrodes 143 and 144 respectively. Each of the output layers 40 and 45 are bonded to the central output terminal 47 with the adhesive coating 102 and 103 respectively. The output portion 32 also comprises output terminals 46 and 48 bonded to the remaining faces of the output ceramic layers 40 and 45. The first common output terminal 46 is bonded to first output ceramic layer 45 with the adhesive coating 101, and the second common output terminal 48 is bonded to second output ceramic layer 40 with the adhesive coating 104. The output terminals 46 and 48 are referred to as "common" because in this embodiment, they are bonded or attached to the input portions 31 and 33 and are shared with them.

The PT 1 also comprises a first input portion 31. The first input portion 31 comprises a first input ceramic layer 55 having electrodes 151 and 152 on each of its major faces and an adhesive coating 111 and 112 covering each of the electrodes 151 and 152 respectively. The first input portion 31 also comprises a second input ceramic layer 50 having electrodes 153 and 153 on each of its major faces and an adhesive coating 113 and 114 covering each of the electrodes 153 and 154 respectively. Each of the input layers 50 and 55 are bonded to a central terminal 51 with the adhesive coating 112 and 113. The second input layer 50 of the first input portion 31 is bonded to the first common terminal 46 with adhesive coating 114. The first input portion 31 also comprises an outboard terminal 52 bonded to the remaining face of the first input ceramic layer 55 with adhesive coating 111.

The PT 1 also comprises a second input portion 33. The second input portion 33 comprises a first input ceramic layer 60 having electrodes 161 and 162 on each of its major faces and an adhesive coating 121 and 122 covering each of the electrodes 161 and 162 respectively. The second input portion 33 also comprises a second input ceramic layer 65 having electrodes 163 and 164 on each of its major faces and an adhesive coating 123 and 124 covering each of the electrodes 163 and 164 respectively. Each of the input layers 60 and 65 are bonded to a central terminal 61 with the adhesive coating 122 and 123. The first input layer 60 of the second input portion 33 is bonded to the second common terminal 48 with adhesive coating 121. The second input portion 33 also comprises an outboard terminal 62 bonded to the remaining face of the second input ceramic layer 65 with adhesive coating 124.

The input layers 50 and 55, and 60 and 65 are preferably of substantially the same circumference as the output layers 40 and 45. The input layers 50 and 55, and 60 and 65 may also be chosen to be or thinner or thicker than the output layers 40 and 45 or even the same thickness as the output layers 40 and 45 in the direction of polarization depending on the desired resonant frequency of the device. The input and output layers 40, 45, 50 and 55, and 60 and 65 may alternatively all be of different circumferences, but it is preferred that they are all of the same circumference. It is also preferred that the output layers 40 and 45 are of substantially equal thickness and that the input layers 50 and 55, and 60 and 65 are of substantially equal thickness. This allows the resonant characteristics to be more uniform and predictable as well as minimizing the profile of the device. The input layers 50 and 55, and 60 and 65 and output layer 40 and 45 however need not be exactly equal in thickness. This is because the frequency at which the PT is driven corresponds to the total thickness of the PT 1 (including all the ceramic layers 40 and 45, 50 and 55, and 60 and 65, the electrodes 141–144, 151–154 and 161–164, terminals 46, 47, 47 51, 52, 61 and 62 and the adhesive layers 101, 102, 103, 104, 111, 112, 113, 114, 121, 122, 123 and 124) rather than the thickness of individual layers as in a conventional TMPT. Thus the narrow tolerances (thickness equal to a half a wavelength) of the conventional TMPT are not applicable to the present invention, and the layers may be of non-matched thicknesses to add to the anisotropic nature of the PT 1.

The use of two ceramic layers on each input portion 31 and 33 increases both the mass and volume of the PT 1. An increase in the mass of the PT 1 as well as a length increase lowers the resonant frequency of the PT 1 while increasing the gain and power density. The increase in gain is due to the fact that the added mass increases the momentum of the device. The increase in gain results in a higher power to volume ratio. Furthermore, the length of the layers 45 and 45, 50 and 55 and 60 and 65 may be selected to ensure that during operation of the PT, maximum compressive and tensile forces are concentrated at the bond line 56 and 58 between the input 31 and 33 and output 32 portion(s), resulting in increased gain.

As an example of the dimensions of the PT 1, the output portion 32 of the device comprises two PZT disks 40 and 45 each with a diameter of 21 millimeters 10.2 millimeter radius) and a thickness of 2 millimeters. The input portions 31 and 33 each comprise a pair of PZT disks 50 and 55, and 60 and 65 with diameters of 21 millimeters and a thickness of 2 millimeters. Copper foil (3 mils) 46, 47, 48, 51, 52, 61 and 62 is bonded to each major face of the disks 40, 45, 50 and 55, 60 and 65 comprising the input portions 31 and 33 and output portion 32. This PT 1 had a gain of approximately 1:20 and a power output of 80 watts. The dimensions chosen for the PT 1 are only illustrative of the possible configurations for the PT 1, and other shapes and thicknesses are both possible and desirable. For example the composite PT 1 need not be cylindrical, and it need not be as thick in height or diameter. It will be understood that since the PT 1 is polarized in the thickness direction, that a cross-section (slice) of the cylinder may be taken across its height and the composite PT will operate according to the same principles.

Referring to FIG. 6: A composite PT 2 is illustrated which is configured in the shape of a rectangular slab rather than a cylinder. However, the portions of the PT 2 of FIG. 6 remain the same as the PT 1 in FIG. 5. In the center of the device is the output portion 32 comprising two layers 40 and 45 of piezoelectric ceramic material (preferably PZT) bonded to a central terminal 47 and two outboard terminals 46 and 48. To the two outboard terminals 46 and 48 of the output portion 32 are bonded to the input portions 31 and 33 each comprising a pair of input ceramic layers 50 and 55, and 60 and 65 respectively.

The ceramic layers 40 and 45 of the output portion 32 are both polarized in the thickness direction and preferably are polarized towards the center terminal 47 as indicated by the arrows. The ceramic layers 50 and 55 of the input portion 31 and the ceramic layers 60 and 65 of the input portion 33 are also both polarized in the thickness direction and preferably they are polarized toward the center terminals 51 and 61 of the respective input portions 31 and 33 as indicated by the arrows 53 and 54, and arrows 63 and 64 respectively.

FIG. 6 depicts the embodiment of the invention in a rectangular slab shaped configuration as well the preferred embodiment of the connection for electrical leads in order to achieve a significant voltage gain. In the preferred embodiment of the invention, the outboard terminals 46 and 48 of the output portion 32 are both ground connections, and the center terminal 47 is the high voltage output connection. Likewise, the center terminal 51 of the first input portion 31 is the input terminal connected to an input voltage source and the center terminal of the second input portion 33 the input terminal connected to an input voltage source, for input of a voltage potential across the layers 50 and 55, and 60 and 65 of the respective input portions 31 and 33. The outboard terminals 52 and 62 of the first and second input portions 31 and 33 are likewise connected to ground. This provides for a PT 2 wherein all the high voltage terminals 47, 51 and 61 are interior to the PT 2 and the exterior terminals 52 and 62 are grounded, thus reducing the potential for unwanted shorts or discharges.

FIG. 6 depicts the embodiment of the invention in a rectangular slab shaped configuration as well the preferred embodiment of the connection for electrical leads in order to achieve a significant voltage gain. In the preferred embodiment of the invention, the outboard terminals 46 and 48 of the output portion 32 are both ground connections, and the center terminal 47 is the high voltage output connection. Likewise, the center terminal 51 of the first input portion 31 is the input terminal connected to an input voltage source and the center terminal of the second input portion 33 the input terminal connected to an input voltage source, for input of a voltage potential across the layers 50 and 55, and 60 and 65 of the respective input portions 31 and 33. The outboard terminals 52 and 62 of the first and second input portions 31 and 33 are likewise connected to ground. This provides for a PT 2 wherein all the high voltage terminals 47, 51 and 61 are interior to the PT 2 and the exterior terminals 52 and 62 are grounded, thus reducing the potential for unwanted shorts or discharges.

Figure 8:
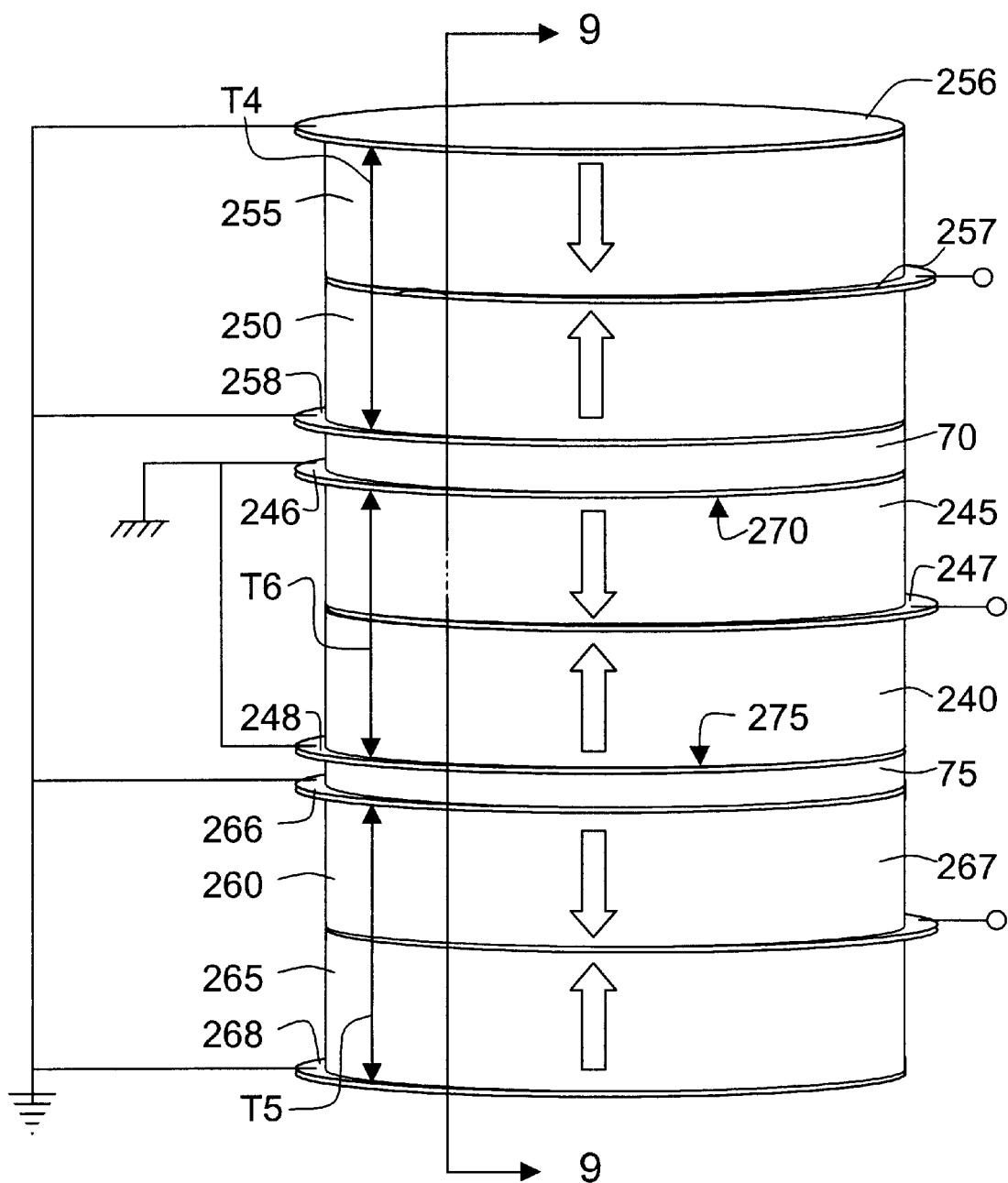
FIG. 8 is a perspective view of another embodiment of a piezoelectric transformer of the present invention using isolation layers and showing the preferred electrical connections.
Figure 9:
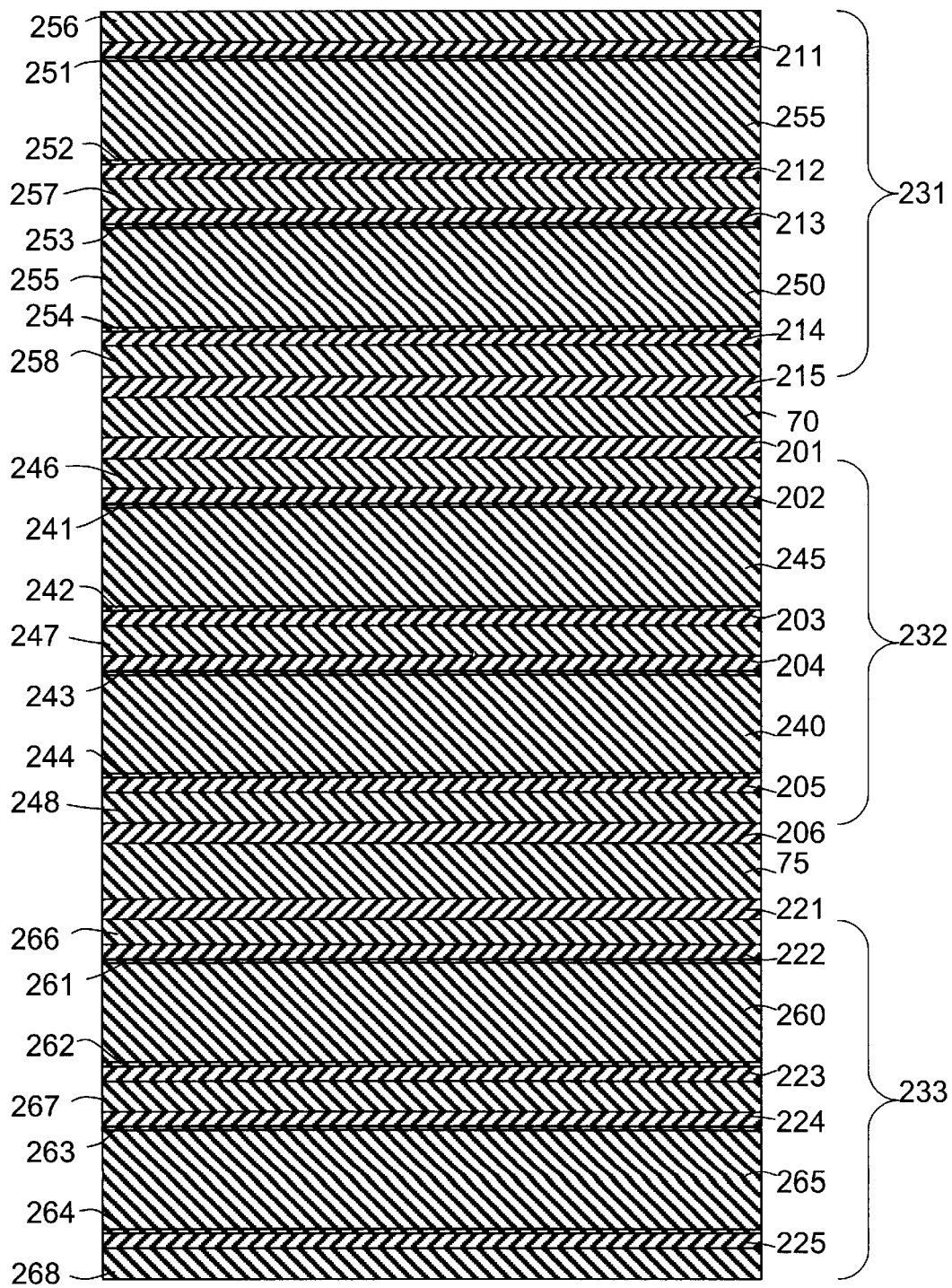
FIG. 9 is a cross-sectional elevation view along line 9—9 of the transformer in FIG. 8 showing the details of construction of the various layers.

Referring to FIGS. 8 and 9: Yet another composite PT 3 is illustrated which is configured in the shape of a cylinder, but has the addition of isolation layers between the input and output layers as well as additional input terminals. However, the remainder of the portions of the PT 3 of FIG. 8 remain the same as the PT 1 in FIG. 5. In addition to the two isolation layers, the PT comprises a first input portion 231 having a first thickness T4, a second input portion 233 having a second thickness T5 and an output portion 232 having a third thickness T6. In the center of the device is the output portion 232 comprising two layers 240 and 245 of piezoelectric ceramic material (preferably PZT) bonded to a central terminal 247 and two outboard output terminals 246 and 248. To the two outboard terminals 246 and 248 of the output portion 232 are bonded isolation layers 70 and 75. To the first isolation layer 70 is bonded the input portion 231 comprising a pair of input ceramic layers 250 and 255 piezoelectric ceramic material (preferably PZT) bonded to a central terminal 252 and two outboard input terminals 251 and 253. To the second isolation layer 75 is bonded the input portion 232 comprising a pair of input ceramic layers 260 and 265 piezoelectric ceramic material (preferably PZT) bonded to a central terminal 262 and two outboard input terminals 261 and 263.

FIG. 9 shows the details of construction of all layers of the PT 3 including the ceramic layers and electrodes, isolation layers, terminals, and adhesive layers. The output portion 232 comprises a first output layer 245 having electrodes 241 and 242 on opposing major faces, as well as a second output layer 240 having electrodes 243 and 244 on opposing major faces. The electrodes 241, 242, 243 and 244 preferably comprise silver or nickel which are electro-deposited on and substantially cover each of the faces of the output layers 240 and 245. The first and second output layers 245 and 240 are bonded to a central output terminal 247 using adhesive layers 203 and 204. The remaining face of the first output layer 245 is bonded to another output terminal 246 with adhesive layer 202, and the remaining face of the second output layer 240 is also bonded to an output terminal 248 with adhesive layer 205. All adhesive layers 202, 203, 204 and 205 in the output portion 232 of the PT 3 preferably comprise CIBA adhesive.

The first input portion 231 comprises a first input layer 255 having electrodes 251 and 252 on opposing major faces, as well as a second input layer 250 having electrodes 253 and 254 on opposing major faces. The electrodes 251, 252, 253 and 254 preferably comprise silver or nickel which are electro-deposited on and substantially cover each of the faces of the input layers 250 and 255. The first and second output layers 255 and 250 are bonded to a central input terminal 257 using adhesive layers 212 and 213. The remaining face of the first input layer 255 is bonded to another input terminal 246 with adhesive layer 211, and the remaining face of the second input layer 250 is also bonded to an input terminal 258 with adhesive layer 214. All adhesive layers 211, 212, 213 and 214 in the first input portion 231 of the PT 3 preferably comprise CIBA adhesive.

The second input portion 233 comprises a first input layer 260 having electrodes 261 and 262 on opposing major faces, as well as a second input layer 265 having electrodes 263 and 264 on opposing major faces. The electrodes 261, 262, 263 and 264 preferably comprise silver or nickel which are electro-deposited on and substantially cover each of the faces of the input layers 260 and 265. The first and second output layers 265 and 260 are bonded to a central input terminal 267 using adhesive layers 222 and 223. The remaining face of the first input layer 260 is bonded to another input terminal 266 with adhesive layer 222, and the remaining face of the second input layer 265 is also bonded to an input terminal 268 with adhesive layer 225. All adhesive layers 222, 223, 224 and 225 in the second input portion 233 of the PT 3 preferably comprise CIBA adhesive.

The PT 3 also comprises a pair of isolation layers 70 and 75 bonded between the output portion 232 of the PT 3 and the input portions 231 and 233. The first isolation layer 70 is bonded between output terminal 246 of the output portion 232 and input terminal 258 of the first input portion 231 using adhesive layers 201 and 215 respectively. The second isolation layer 75 is bonded between output terminal 248 of the output portion 232 and input terminal 266 of the second input portion 233 using adhesive layers 206 and 221 respectively. Each isolation layer 70 and 75 preferably comprises a layer for example of alumina, ceramic, dielectric or other rigid non-conductive material. The isolation layers 70 and 75 preferably extend at least up to the edges of each terminal to which they are bonded in order to prevent electrical contact between them.

The ceramic layers 240 and 245 of the output portion 232 are both polarized in the thickness direction and preferably are polarized towards the center terminal 247 as indicated by the arrows. The ceramic layers 250 and 255 of the input portion 231 and the ceramic layers 260 and 265 of the input portion 233 are also both polarized in the thickness direction and preferably they are polarized toward the respective center terminals 251 and 261 of the respective input portions 231 and 233 as indicated by the arrows 253 and 254, and arrows 263 and 264 respectively.

Referring again to FIG. 8: In the preferred electrical connection scheme for the transformer, the voltage input is provided at the central terminals 257 and 267 of the input portions 231 and 233, and the output is taken at the central terminal of the output portion 232. Although shown as separate inputs, it is preferred that both input terminals 257 and 267 are connected to a common voltage source. Also, the input portions 231 and 233 preferably have their outboard terminals 256 and 258, and 266 and 268 respectively connected to ground. The outboard terminals 246 and 248 of the output portion 232 preferably are also connected to ground, and more preferably a chassis ground rather than the earth ground of the input portions 231 and 233.

Referring again to FIG. 5: In operation, a voltage of a first polarity is applied to input terminals 51 and 61 connected to electrodes 152 and 153 and 162 and 163 respectively. When this voltage of a first polarity is applied to the first input terminal 51, a voltage potential exists between the center terminal 51 and each of the outer terminals 52 and 48 bonded to the first input portion 31. This voltage potential causes input ceramic layers 50 and 55 of the first input portion 31 to piezoelectrically contract in the thickness direction (i.e. a d33 mode deformation parallel to the direction of polarization of the layers 50 and 55). When a voltage of an opposite polarity is applied to input terminal 51, a voltage potential again exists between the center terminal 51 and each of the outer terminals 52 and 48 bonded to the first input portion 31. The voltage potential causes input ceramic layers 50 and 55 to piezoelectrically expand in the thickness direction (i.e. also a d33 mode deformation parallel to the direction of polarization of the layers 50 and 55).

Likewise, when voltage of a first polarity is applied to the second input terminal 61, a voltage potential exists between the center terminal 61 and each of the outer terminals 62 and 46 bonded to the second input portion 33. This voltage potential causes input ceramic layers 60 and 65 of the second input portion 33 to piezoelectrically contract in the thickness direction (i.e. a d33 mode deformation parallel to the direction of polarization of the layers 60 and 65). When a voltage of an opposite polarity is applied to input terminal 61, a voltage potential again exists between the center terminal 61 and the outer terminals 62 and 46 bonded to the second input portion 33. The voltage potential causes input ceramic layers 60 and 65 to piezoelectrically expand in the thickness direction (i.e. also a d33 mode deformation parallel to the direction of polarization of the layers 60 and 65).

Thus, by applying an alternating voltage at a given frequency to the input portions 31 and 33 of the PT 1, the ceramic layers 50 and 55, and 60 and 65 cyclically expand and contract (a d33 mode thickness vibration) at the frequency of the applied alternating voltage. The d33 mode is the preferred vibration mode because it is a much more efficient mode of vibration as compared to the d31 mode vibration (as is Rosen PTs).

As the ceramic layers 50 and 55, and 60 and 65 of the input portions 31 and 33 of the PT 1 expand, the input portions 31 and 33 travel outwardly. Conversely, as the ceramic layers So and 55, and 60 and 65 of the input portions 31 and 33 of the PT 1 contract, the input portions 31 and 33 travel inwardly. When the polarity of the voltage applied to the ceramic layers 50 and 55, and 60 and 65 of the input portions 31 and 33 is reversed, the direction of expansion or contraction of the ceramic layers 50 and 55, and 60 and 65 almost instantaneously reverses. The translational direction of movement of the input portions 31 and 33 does not change as quickly. Like a coupled mass-spring system, the momentum of the input portions 31 and causes them to continue travelling further in their original direction before changing direction to move in same the direction as that of the expansion of contraction of the ceramic layers 50 and 55, and 60 and 65 comprising each input portion 31 and 33.

Because the output portion 32 is firmly bonded to the input portions 31 and 33, the continued travel of the input portions 31 and 33 in their original direction causes the output portion 32 to deform, i.e., causes the ceramic layers 40 and 45 to expand or contract. More specifically, as the voltage polarity changes, the input layers 31 and 33 continue traveling outwardly and cause the faces of the output portion 32 travel outwardly at the bond lines 56 and 58, causing the layers 40 and 45 of the output portion 32 to expand. As the polarity of the applied voltage again changes, the input layers 31 and 33 continue traveling inwardly and cause the faces of the output portion 32 to travel inwardly at the bond lines 56 and 58, causing the output layers 40 and 45 of the output portion 32 to compress.

Thus, the movement and changes of direction (vibration) of the input portions 31 and 33 cause the layers 40 and 45 of the output portion 32 to mechanically strain or deform (due to inertia) in the thickness direction, vibrating at or near the drive frequency of the voltage applied to the input portions 31 and 33. Thus, the d33 mode thickness vibration of the input portions 31 and 33 causes a g33 mode thickness vibration in the output portion 32. The g33 vibration (deformation) of the output portion 32 piezoelectrically generates an alternating voltage across the electrodes 141 and 142, and 143 and 144, and therefore across the terminals 47 and 48, and 47 and 46 respectively bonded to the ceramic layers 40 and 45 of the output portion 32.

Referring again to FIG. 8: In the isolated PT 3, a voltage of a first polarity is applied to input terminals 257 and 267 connected to electrodes 252 and 253 and 262 and 263 respectively. When this voltage of a first polarity is applied to the first input terminal 257, a voltage potential exists between the center terminal 257 and each of the outer terminals 256 and 258 bonded to the first input portion 231. This voltage potential causes input ceramic layers 250 and 255 of the first input portion 231 to piezoelectrically contract in the thickness direction (i.e. a d33 mode deformation parallel to the direction of polarization of the layers 250 and 255). When a voltage of an opposite polarity is applied to input terminal 257, a voltage potential again exists between the center terminal 257 and each of the outer terminals 256 and 258 bonded to the first input portion 231. The voltage potential causes input ceramic layers 250 and 255 to piezoelectrically expand in the thickness direction (i.e. also a d33 mode deformation parallel to the direction of polarization of the layers 250 and 255).

Likewise, when voltage of a first polarity is applied to the second input terminal 267, a voltage potential exists between the center terminal 267 and each of the outer terminals 266 and 268 bonded to the second input portion 233. This voltage potential causes input ceramic layers 260 and 265 of the second input portion 233 to contract piezoelectrically in the thickness direction (i.e. a d33 mode deformation parallel to the direction of polarization of the layers 260 and 265). When a voltage of an opposite polarity is applied to input terminal 267, a voltage potential again exists between the center terminal 267 and the outer terminals 266 and 268 bonded to the second input portion 233. The voltage potential causes input ceramic layers 260 and 265 to piezoelectrically expand in the thickness direction (i.e. also a d33 mode deformation parallel to the direction of polarization of the layers 260 and 265).

Thus, by applying an alternating voltage at a given frequency to the input portions 231 and 233 of the PT 3, the ceramic layers 250 and 255, and 260 and 265 cyclically expand and contract (a d33 mode thickness vibration) at the frequency of the applied alternating voltage. As the ceramic layers 250 and 255, and 260 and 265 of the input portions 231 and 233 of the PT 3 expand, the input portions 231 and 233 travel outwardly. Conversely, as the ceramic layers 250 and 255, and 260 and 265 of the input portions 231 and 233 of the PT 3 contract, the input portions 231 and 233 travel inwardly. As in the operation of the PTs of FIGS. 5 and 7, when the polarity of the voltage applied to the ceramic layers 250 and 255, and 260 and 265 of the input portions 231 and 233 is reversed, the direction of expansion or contraction of the ceramic layers 250 and 255, and 260 and 265 almost instantaneously reverses, but the translational direction of movement of the input portions 231 and 233 does not change as quickly. Like a coupled mass-spring system, the momentum of the input portions 231 and 233 causes them to continue travelling further in their original direction before changing direction to move in same the direction as that of the expansion of contraction of the ceramic layers 250 and 255, and 260 and 265 comprising each input portion 231 and 233.

Because the output portion 232 is firmly bonded to the input portions 231 and 233, indirectly through the respective isolation layer 70 and 75, the continued travel of the input portions 231 and 233 in their original direction causes the output portion 232 to deform, i.e., causes the ceramic layers 240 and 245 to expand or contract. More specifically, as the voltage polarity changes, the input layers 231 and 233 and isolation layers 70 and 75 continue traveling outwardly and cause the faces of the output portion 232 travel outwardly at the bond lines 270 and 275, causing the layers 240 and 245 of the output portion 232 to expand. As the polarity of the applied voltage again changes, the input layers 231 and 233 and isolation layers 70 and 75 continue traveling inwardly and cause the faces of the output portion 232 to travel inwardly at the bond lines 270 and 275, causing the output layers 240 and 245 of the output portion 232 to compress.

Thus, the movement and changes of direction (vibration) of the input portions 231 and 233 cause the layers 240 and 245 of the output portion 232 to mechanically strain or deform (due to inertia) in the thickness direction, vibrating at or near the drive frequency of the voltage applied to the input portions 231 and 233. Thus, the d33 mode thickness vibration of the input portions 231 and 233 causes a g33 mode thickness vibration in the output portion 232. The g33 vibration (deformation) of the output portion 232 piezoelectrically generates an alternating voltage across the electrodes 241 and 242, and 243 and 244, and therefore across the terminals 247 and 248, and 247 and 246 respectively bonded to the ceramic layers 240 and 245 of the output portion 232.

The use of two ceramic layers on each input portion 231 and 233 as well as using isolation layers 70 and 75 increases both the mass and volume of the PT 3. An increase in the mass of the PT 3 as well as a length increase further lowers the resonant frequency of the PT 3 while increasing the gain and power density. The increase in gain is due to the fact that the added mass increases the momentum of the device. The increase in gain results in a higher power to volume ratio. Furthermore, the length of the layers 245 and 245, 250 and 255, 260 and 265, and 70 and 75 may be selected to ensure that during operation of the PT 1, maximum compressive and tensile forces are concentrated at the bond line 270 and 275 between the input 231 and 233 and output 232 portion(s), resulting in increased gain.

The frequency applied to the input portions 31 and 33 or 213 and 233 is chosen to correspond to the natural resonant frequency of the PTs 1, 2 or 3 and high deformation in the output of the device and higher gains are realized. More specifically, in the present PTs 1, 2 and 3, the frequency of the applied voltage is chosen to correspond to the resonant frequency of the PT in the longitudinal direction, i.e., along the whole length of the PT 1, 2 and 3 rather than in the radial direction.

The PTs 1, 2 and 3 of the present invention takes advantage of using the resonant frequency corresponding to the longitudinal dimension of the PT, i.e., the dimension corresponding to the sum of the thicknesses of all ceramic, adhesive and electrode layers (and in PT 3, the isolation layer). The resonant frequency in the longitudinal dimension is lower than resonant frequency along the width or radius of the PT. The PTs 1, 2 and 3 can take advantage of using the longitudinal resonant frequency because of the anisotropic nature of the composite structure in that dimension. More specifically, the PTs 1, 2 and 3 have an anisotropic nature along the axis of vibration because of the differences between the material properties of the respective layers in the longitudinal dimension, i.e., the dimension having the longest length determining a resonant mode. By having a structure that alternates between terminal, adhesive, electrode and ceramic layers, (and isolation layers) the composite structure has spring constant in the longitudinal dimension, parallel to the axis of vibration. This construction allows the input portions 31 and 33 and the output portion 32 to act as a coupled harmonic oscillator having a composite spring constant along the longitudinal dimension of the PT 1. Thus, the construction of the present PTs with the output portion 32 or 232 between two input portions 31 and 33, or 231 and 233 as well as the anisotropic nature of the PTs in the longitudinal dimension allows the present device to function using the longitudinal resonant frequency.

The resonant vibration of the present PTs 1, 2 and 3 is different from that of other prior PTs. Thickness mode PTs vibrate in the thickness dimension, however their resonant frequency is controlled by the thickness of the individual layers of the PT rather than the length of the whole PT. Typical thickness mode PTs are not made as long (i.e., having fewer and thinner layers) as the present PT because thickness mode PTs constructed with as many layers or as thick as the present device would not be efficient. Furthermore, typical thickness mode PTs are not operable under an applied frequency corresponding to the total thickness of those devices, also for efficiency reasons. Lastly, conventional TMPTs do not exhibit the gain and power of the present PTs, such as the PT 1 of FIG. 5, which has a gain on the order of 20–80, and power over 100 watts.

The construction of the present PTs as multilayer composite devices also eliminates the development of nodes at the terminals separating individual layers as is present in typical thickness mode devices. Typical thickness mode devices have nodes (having no vibration) at each of the electrodes as each layer vibrates at the resonant frequency corresponding to the thickness of each individual layer. Because of the composite and anisotropic nature of the present PTs 1, 2 and 3 nodes do not develop at each electrode and energy is transmitted from one ceramic layer to another through the adjacent electrode, adhesive, terminal and isolation layers. Thus, the transmission of vibrational energy between and through the layers of the PT allows the resonant frequency of the PT to correspond to that of the total length of the PT.

The resonant frequency of the PTs 1, 2 and 3 depends not only on the length of the device (relative to the wavelength of the applied frequency), but also the mass of the device. Increasing the length and the mass of the PT further lowers the resonant frequency of the device. The length and mass of the input portions 31 and 33, or 231 and 233 can also be chosen to increase the momentum of both the input portions 31 and 33, or 231 and 233 and the output portion 32 or 232 while concentrating the compressive and tensile forces about the bond-lines 56 and 58, or 270 and 275 between the input portions and output portion. Increasing these compressive and tensile forces also increases the gain realized in the PT. The design also reduces dissipative losses in the PT by allowing it to operate at a lower frequency which reduces the heat generated by the device (heat which can increase dielectric losses). The greater mass for a PT also provides greater momentum and therefore generates higher voltage gains as well as increased power handling capacity.

Another advantage is that in the PT 3 of FIG. 8, since the mechanical energy is transmitted between various layers by thickness vibration, the isolation layer can be made arbitrarily thick, providing much greater isolation than prior devices. In other words, the maximum thickness of isolation layers in radial devices is limited because of the limited ability of these layers to transmit radial deformations of the layers due to the shear stress in the isolation layer. Because the energy transmitted in the present PT 3, the attenuation due to shear is not present and practically all of the thickness vibration is transmitted from the input portions 231 and 233 to the output portion 232.

While the above description contains many specificities, these should not be construed as limitations on the scope of the invention, but rather as an exemplification of one preferred embodiment thereof. Many other variations are possible, for example:

While in the preferred embodiment of the invention the ceramic layers are preferably constructed of a PZT ceramic material, other electroactive materials may be used in its place;

The ceramic layers can be piezoelectric, ferroelectric or other electroactive elements;

While the input portions preferably each comprise two layers of ceramic, the input portions may comprise as few as one ceramic layer or may be of a multi-layer construction;

The shape of the PT need not be cylindrical or slab shaped, and many other shapes or configurations are possible;

The direction of polarization of the input and output ceramic layers need not be toward the central electrode, but may be away from the central electrode;

The ceramic layers may be mechanically bonded to the terminals or electrodes using other adhesives such as imides, resins, epoxies and the like or may be chemically bonded such as by cofiring the ceramic to metallization layers;

The electrodes may comprise other metallic or conductive materials and may comprise an adhesive such as a conductive epoxy layer;

The high voltage electrodes need not be internal to the PT and need not be the central electrode of each layer, but may comprise the external electrodes of any of the layers.

Accordingly, the scope of the invention should be determined not by the embodiment illustrated, but by the appended claims and their legal equivalents.

I claim:

1. A piezoelectric transformer, comprising:
   a first input portion having a first thickness, said first input portion further comprising;
      a first input ceramic layer having first and second opposing electroded major faces and polarized in a direction parallel to an axis normal to said first and second opposing major faces; and
      a first input terminal adjacent said first major face of said first input ceramic layer;
   a second input portion having a second thickness, said second input portion further comprising;
      a second input ceramic layer having first and second opposing electroded major faces and polarized in a direction parallel to said axis; and
      a second input terminal adjacent said first major face of said second input ceramic layer; and
   an output portion having a third thickness, said output portion further comprising;
      a first output ceramic layer having first and second opposing electroded major faces and polarized in a direction parallel to said axis;
      a second output ceramic layer having first and second opposing electroded major faces and polarized in a direction parallel to said axis;
      an output terminal adjacent said first major face of said first output ceramic layer and said first face of said second output ceramic layer;
      a first common terminal adjacent said second major face of said first output ceramic layer and said second major face of said first input ceramic layer; and
      a second common terminal adjacent said second major face of said second output ceramic layer and said second major face of said second input ceramic layer;
   wherein upon application of a first oscillating voltage across said first input terminal and said first common terminal, said first input ceramic layer alternatingly expands and contracts in said direction parallel to said axis;
   and wherein upon application of a second oscillating voltage across said second input terminal and said second common terminal, said second input ceramic layer alternatingly expands and contracts in said direction parallel to said axis;
   and wherein said expansion and contraction of said first and second input ceramic layers in said direction parallel to said axis causes a first oscillating mechanical strain of said first and second output ceramic layers parallel to said axis;
   and wherein said first oscillating mechanical strain of said first and second output ceramic layers piezoelectrically generates a third oscillating voltage between said first and second faces of each of said first and second output ceramic layers.

2. The piezoelectric transformer of claim 1, wherein said first input portion further comprises:
   a third input ceramic layer having first and second opposing electroded major faces and polarized in a direction parallel to said axis;
      said first major face of said third input ceramic layer being adjacent said first input terminal; and
   a third input terminal;
      said second major face of said third input ceramic layer being adjacent said third input terminal;
   wherein upon application of said first oscillating voltage across said first input terminal and said third input terminal, said third input ceramic layer alternatingly expands and contracts in said direction parallel to said axis.

3. The piezoelectric transformer of claim 2, wherein said second input portion further comprises:
   a fourth input ceramic layer having first and second opposing major faces and polarized in a direction parallel to said axis;
      said first major face of said fourth input ceramic layer being adjacent said second input terminal; and
   a fourth input terminal;
      said second major face of said fourth input ceramic layer being adjacent said fourth input terminal;
   wherein upon application of said second oscillating voltage across said second input terminal and said fourth input terminal, said fourth input ceramic layer alternatingly expands and contracts in said direction parallel to said axis.

4. The piezoelectric transformer of claim 3,
   wherein said first input portion is bonded to said output portion with an adhesive;
   and wherein said second input portion is bonded to said output portion with an adhesive.

5. The piezoelectric transformer of claim 4,
   wherein said first common terminal further comprises a first bondline between said first face of first input ceramic layer and said first face of first output ceramic layer;

and wherein said mechanical strain in said first output ceramic layer is concentrated at said first bondline.

6. The piezoelectric transformer of claim 5,
wherein said second common terminal further comprises a second bondline between said first face of second input ceramic layer and said first face of second output ceramic layer;
and wherein said mechanical strain in said second output ceramic layer is concentrated at said second bondline.

7. The piezoelectric transformer of claim 6, further comprising:
means for applying an oscillating voltage of a first frequency across said first or second input ceramic layers.

8. The piezoelectric transformer of claim 7,
wherein said first frequency is a resonant frequency of oscillation parallel to said axis;
and wherein a sum of said first, second and third thicknesses equals an integral multiple of half-wavelengths of said resonant frequency.

9. The piezoelectric transformer of claim 1,
wherein said first output ceramic layer and said second output ceramic layer are polarized in opposite directions parallel to said axis.

10. The piezoelectric transformer of claim 3,
wherein said first input ceramic layer and said third input ceramic layer are polarized in opposite directions parallel to said axis.

11. The piezoelectric transformer of claim 3,
wherein said second input ceramic layer and said fourth input ceramic layer are polarized in opposite directions parallel to said axis.

12. The piezoelectric transformer of claim 7,
wherein said first thickness does not equal an integral multiple of half-wavelengths of said resonant frequency;
and wherein said second thickness does not equal an integral multiple of half-wavelengths of said resonant frequency;
and wherein said third thickness does not equal an integral multiple of half-wavelengths of said resonant frequency.

13. A piezoelectric transformer, comprising:
a first input portion having a first thickness, said first input portion further comprising;
a first input ceramic layer having first and second opposing electroded major faces and polarized in a direction parallel to an axis normal to said first and second opposing major faces;
a first input terminal adjacent said first major face of said first input ceramic layer; and
a second input terminal adjacent said second major face of said first input ceramic layer
a second input portion having a second thickness, said second input portion further comprising;
a second input ceramic layer having first and second opposing electroded major faces and polarized in a direction parallel to said axis;
a third input terminal adjacent said first major face of said second input ceramic layer; and
a fourth input terminal adjacent said second major face of said second input ceramic layer;
a first isolation layer having first and second opposing major faces;
said first major face of said first isolation layer being adjacent said second input terminal;
a second isolation layer having first and second opposing major faces;
said first major face of said second isolation layer being adjacent said fourth input terminal;
an output portion having a third thickness, said output portion further comprising;
a first output ceramic layer having first and second opposing electroded major faces and polarized in a direction parallel to said axis;
a second output ceramic layer having first and second opposing electroded major faces and polarized in a direction parallel to said axis;
a first output terminal adjacent said first major face of said first output ceramic layer and said first face of said second output ceramic layer;
a second output terminal adjacent said second major face of said first output ceramic layer and said second major face of said first isolation layer; and
a third output terminal adjacent said second major face of said second output ceramic layer and said second major face of said second isolation layer;
wherein upon application of a first oscillating voltage across said first and second input terminals, said first input ceramic layer alternatingly expands and contracts in said direction parallel to said axis;
and wherein upon application of a second oscillating voltage across said third and fourth input terminals, said second input ceramic layer alternatingly expands and contracts in said direction parallel to said axis;
and wherein said expansion and contraction of said first and second input ceramic layers in said direction parallel to said axis causes a first oscillating mechanical strain of said first and second output ceramic layers parallel to said axis;
and wherein said first oscillating mechanical strain of said first and second output ceramic layers piezoelectrically generates a third oscillating voltage between said first and second faces of each of said first and second output ceramic layers.

14. The piezoelectric transformer of claim 13, wherein said first input portion further comprises:
a third input ceramic layer having first and second opposing electroded major faces and polarized in a direction parallel to said axis;
said first major face of said third input ceramic layer being adjacent said first input terminal; and
a fifth input terminal;
said second major face of said third input ceramic layer being adjacent said fifth input terminal;
wherein upon application of said first oscillating voltage across said first input terminal and said fifth input terminal, said third input ceramic layer alternatingly expands and contracts in said direction parallel to said axis.

15. The piezoelectric transformer of claim 14, wherein said second input portion further comprises:
a fourth input ceramic layer having first and second opposing major faces and polarized in a direction parallel to said axis;
said first major face of said fourth input ceramic layer being adjacent said third input terminal; and
a sixth input terminal;
said second major face of said fourth input ceramic layer being adjacent said sixth input terminal;
wherein upon application of said second oscillating voltage across said third input terminal and said sixth input terminal, said fourth input ceramic layer alternatingly expands and contracts in said direction parallel to said axis.

* * * * *